United States Patent [19]

Fellinger et al.

[11] 4,185,245
[45] Jan. 22, 1980

[54] FAULT-TOLERANT CLOCK SIGNAL DISTRIBUTION ARRANGEMENT

[75] Inventors: Frank Fellinger, Delaware, Ohio; Santanu Das, Stamford, Conn.

[73] Assignee: International Telephone and Telegraph Corporation, New York, N.Y.

[21] Appl. No.: 906,087

[22] Filed: May 15, 1978

[51] Int. Cl.$^2$ .............................................. H03K 5/00
[52] U.S. Cl. ................................... 328/103; 307/219; 307/269; 328/104
[58] Field of Search ................... 307/208, 219, 223 R, 307/269; 328/61, 62, 63, 70, 71, 74, 103, 104, 105, 153, 154

[56] References Cited

U.S. PATENT DOCUMENTS

| | | | |
|---|---|---|---|
| 3,479,603 | 11/1969 | Overstreet, Jr. | 307/219 X |
| 3,803,568 | 4/1974 | Higashide | 307/219 X |
| 3,900,741 | 8/1975 | Fletcher et al. | 307/219 X |
| 3,965,432 | 6/1976 | Denenberg et al. | 328/61 |
| 4,019,143 | 4/1977 | Fallon et al. | 307/219 X |
| 4,025,874 | 5/1977 | Abbey | 307/219 X |

Primary Examiner—John Zazworsky
Attorney, Agent, or Firm—James B. Raden; Marvin M. Chaban

[57] ABSTRACT

A fault-tolerant clock signal distribution system for a plurality of equipment units is disclosed. Fault tolerance is achieved by independent bussing of clock signals from each of a pair of duplicated clock sources to a plurality of clock receiver units, each receiver unit associated with one of the plurality of equipment units and including sequential logic apparatus operative to examine the two clock signal trains bussed to the clock receiver unit and to ignore that signal train that phase lags the other. In case the phase leading clock source or its transmission bus fails, the remaining clock signal takes over. Because the outputs of the duplicated clock sources are distributed over separate busses, either source may comprise the phase-leading clock at any particular clock receiver unit. The phase difference between the two clock source outputs is kept small enough such that any resultant irregularity in the clock receiver unit output upon failure of one of the two clock sources or transmission busses will not affect the normal operation of the equipment units served by the clock distribution arrangement.

6 Claims, 5 Drawing Figures

FAULT-TOLERANT CLOCK SIGNAL DISTRIBUTION ARRANGEMENT

BACKGROUND OF THE INVENTION

1. Field of the Invention

The invention is related to arrangements for providing highly reliable timing signal distribution to a plurality of equipment units operating under a common system timing constraint. More particularly, the invention relates to fault-tolerant distribution of duplicated clock signals to a plurality of communication system equipment units.

2. Description of the Prior Art

Many prior art systems provide redundancy among various equipment entities to achieve high reliability. In equipment combinations such as electronic telephone switching systems, for example, critical timing sources are duplicated and arranged for fault-tolerant operation.

Examples of such fault-tolerant clock sources are described in U.S. Pat. Nos. 3,900,741—Fletcher et al., 3,965,432—Denenberg et al., and 4,025,874—Abbey. Such teachings deal with the provision of maintaining a clock source output in the presence of a disabling fault in one of the redundant sources. One approach, taught in U.S. Pat. Nos. 3,965,432 and in 4,025,874, utilizes a master/slave pair of clock sources. Another approach, as represented by U.S. Pat. No. 3,900,741, utilizes a predetermined quorum of a plurality of clock sources to furnish a fault-tolerant clock output.

In systems such as electronic time division multiplex PCM switching systems, the reliable distribution of the various timing signals also becomes an important requirement. The above cited relevant art does not address fault-tolerant signal distribution, but rather deals only with providing a fault-tolerant source of timing signals. There is therefore a need in the art for provision of fault-tolerant distribution, or bussing, of system clock signals among a plurality of system equipment units.

SUMMARY OF THE INVENTION

It is therefore an object of this invention to provide additional system reliability by introducing fault-tolerance into the system clock distribution arrangement.

Accordingly, the invention comprises an arrangement for providing fault-tolerant distribution of clock signals to a plurality of equipment units. First and second redundant sources of each clock signal to be distributed are coupled to each of the served equipment units via respective first and second transmission means, such as twisted cable pairs. Each transmission means for each distributed clock signal is coupled to each equipment unit via a clock receiver unit that includes sequential logic means operative to examine the two clock signal trains sent over the first and second transmission means and to ignore that clock signal train that phase lags the other. The phase leading clock signal is then passed to the clock receiver unit output for appropriate distribution to points within the associated equipment unit.

Because the outputs of the duplicated clock sources are distributed over separate transmission means, or busses, it is a feature of the invention that either source may comprise the phase-leading clock signal train at any particular clock receiver unit.

It is a further feature of the invention that a fault in one transmission means does not affect the operation of the mate transmission means carrying the clock signal of identical frequency.

DRAWING

These and other objects and features of the invention will become apparent from a reading of a description of a preferred embodiment taken in conjunction with the drawing in which:

FIG. 1 depicts a functional block diagram of a fault-tolerant clock distribution system arranged in accordance with the principles of the invention.

FIG. 2 sets forth a schematic diagram of a typical clock receiver unit of FIG. 1, and FIGS. 3A, 3B, and 3C show timing diagrams of the logic level signals appearing at identically labelled points of the schematic of FIG. 2.

DESCRIPTION OF THE PREFERRED EMBODIMENT

Referring to FIG. 1, an integral number N of replicated equipment units 140-1 through 140-N are the entities to be supplied with timing signals from duplicated clock signal sources $C_M$ 101 and $C_S$ 102. Equipment units 140-3 through 140-(N-1) are not shown. $C_M$ 101 could comprise a master clock while $C_S$ 102 could comprise a clock slaved to $C_M$ 101.

The equipment units 140-1 through 140-N could, for the sake of example only, comprise switch groups of a time division multiplex PCM switching system such as that described in U.S. Pat. No. 3,912,873 issued Oct. 14, 1975 and assigned to the same assignee as the instant invention.

For the illustrative embodiment of FIG. 1, signals having the highest and lowest clock frequencies are transmitted to the equipment units. Any other required clock frequencies are derived locally at each equipment unit. Master clock $C_M$ 101 furnishes a first clock signal at the highest system frequency at path 110M and a first clock signal at the lowest system frequency at path 120M. Slave clock $C_S$ 102 furnishes a second clock signal at the highest system frequency at path 110S and a second clock signal at the lowest system frequency at path 120S. Preferably, paths 110M, 120M, 110S, and 120S comprise dc-balanced twisted cable pairs. Bus taps 110M-1 through 110M-N of bush path 110M are respectively coupled to first inputs of clock receiver units 130-1H through 130-NH. Taps 110S-1 through 110S-N of bus path 110S are respectively coupled to second inputs of clock receiver units 130-1H through 130-NH. Taps 120M-1 through 120M-N of bus path 120M are respectively coupled to first inputs of clock receiver units 130-1L through 130-NL. Taps 120S-1 through 120S-N of bus path 120S are respectively coupled to second inputs of clock receiver units 130-1L through 130-NL. Hence, each clock receiver unit of FIG. 1 has inputs coupled to first and second sources of clock signals at the frequency of interest.

The outputs of the clock receiver units 1-H through N-H and 1-L through N-L respectively couple clock signals at the highest and lowest system clock frequencies to each of the equipment units, 140-1 through 140-N. Only equipment unit 140-1 of FIG. 1 shows exemplary details of clock signal distribution points and auxiliary frequency generation apparatus. The arrangement shown as block A of 140-1 is, for the present embodiment, the same arrangement used, but not shown in FIG. 1, for the other equipment units, 140-2 through 140-N.

Assuming, for the sake of example only, that the equipment units of FIG. 1 are the digital switch groups of a PCM switching system such as that of the above-referenced U.S. Pat. No. 3,912,873, it will be recognized by those skilled in the art that several clock frequencies are required for the operation of such a digital switching network. To simplify the clock distribution system and to avoid time delay uncertainties among the various required clock signals, only the highest and lowest system clock frequency signals are transmitted to all switch groups via the previously described twisted pair bussing arrangement and clock receiver units depicted in FIG. 1. The highest frequency clock could, for example, comprise the synchronous network clock, while the lowest frequency clock could, for example, comprise a framing clock used for reference timing whenever the system PCM switching functions are being reframed. All other clock frequencies required for operation of the digital switching network would be derived from the highest frequency synchronous network clock by means of dividing or counter chains and phase-locked loop techniques.

Hence, for illustrative example, assume the highest system clock frequency is 2.048 MHz while the lowest system clock frequency is 666⅔ Hz. Then the 2.048 MHz signal could be coupled as shown in FIG. 1 from output 1-H of clock receiver unit 130-1H to switch group distribution points and to counter chain 150 via path 171. The 666⅔ Hz signal could be coupled, as shown in FIG. 1, from output 1-L of clock receiver unit 130-1L to switch group distribution points and to a counter 150 reset input via path 172. Various other required clock frequencies are then derived from counter chain 150. For example, a 4 KHz clock could be presented to path 173 for distribution to various points in the switch group 140-1. Similarly, an 8 KHz clock could be derived at path 174 and coupled via path 180 to phase-locked loop circuit 160 for derivation at path 175 of a clock signal having a frequency such as 1.544 MHz, the PCM transmission bit rate for a T1-type PCM transmission format.

Clock receiver unit 130-1H of FIG. 1 is shown in detailed schematic form in FIG. 2. All other clock receiver units of FIG. 1 are identical in detail to the circuitry depicted in FIG. 2.

As seen from FIG. 2, tap 110M-1 of twisted cable pair bus 110M of FIG. 1 is terminated at clock receiver unit 130-1H of FIG. 2 by high impedance bus receiver amplifier 201 and by resistance 241, chosen to minimize signal reflections. In a similar manner, tap 110-S of twisted cable pair bus 110S is terminated by high impedance bus receiver amplifier 202 and resistance 242. By using bus receiver amplifier 201 and 202, a fault within the logic circuitry of a clock receiver unit will not affect either twisted cable pair bus connected to it. Amplifiers 201 and 202 could, for example, be chosen as the commercially-available type 75107, described in *The TTL Data Book for Design Engineers*- 2 Ed. (1976) by Texas Instruments, Inc.

Output 231 of bus receiver amplifier 201 is coupled to the single input of NAND gate 211 and to a first input of NAND gate 213. Output 232 of bus receiver amplifier 202 is coupled to the single input of NAND gate 212 and to a second input of NAND gate 213. The outputs of NAND gates 211 and 212 are respectively coupled to first and second inputs of NAND gate 214. The output of NAND gate 214 is coupled to a first input of NAND gate 215 and to a first input of NAND gate 218. The output of NAND gate 213 is coupled to a first input of NAND gate 216 and a first input of NAND gate 219. The output of NAND gate 215 is coupled to a second input of NAND gate 216, while the output 233 of NAND gate 216 is coupled to a second input of NAND gate 215 and to the single input of NAND gate 217. The output of NAND gate 217 is coupled to a second input of NAND gate 218, while the output of NAND gate 218 is coupled to a second input of NAND gate 219. The output of NAND gate 219 is coupled to the output 1-H of clock receiver unit 130-1H.

With the logic elements incorporated as described above in conjunction with FIG. 2, it can be shown that the following sequential logic design equations are implemented. Let $f_1$ designate the logic signal carried at path 233 of FIG. 2, $C_M$ designate the master clock signal appearing at path 231 of FIG. 2, $C_S$ designate the slave clock signal appearing at path 232 of FIG. 2, and $f_2$ designate the logic signal appearing at clock receiver unit output 1-H of FIG. 2. Then the circuit of FIG. 2 implements the following design equations:

$$F_1 = C_M \cdot C_S + f_1 \cdot (C_M + C_S)$$

$$F_2 = C_M \cdot C_S + \overline{f_1} \cdot (C_M + C_S)$$

where $F_1$ and $F_2$ represents the new logic states of $f_1$ and $f_2$ whenever $C_M$ or $C_S$ change logic levels.

The timing diagram of FIG. 3A shows the relationship of the logic level waveforms at pertinent locations of the clock receiver unit circuitry of FIG. 2 for the case where no faults are encountered in either clock source bus 110M or 110S. The various waveforms of FIG. 3A (and FIGS. 3B and 3C to be discussed below) are given the identical designations of the points in the circuit diagram of FIG. 2 whose logic level timing waveforms are depicted. The received clock pulse train appearing at point 231 is assumed leading in phase the clock pulse train appearing at point 232. Under this condition, the clock receiver unit sequential logic, in accordance with the above design equations, forces its output 1-H to track the leading input clock pulse train.

Figure 3A:
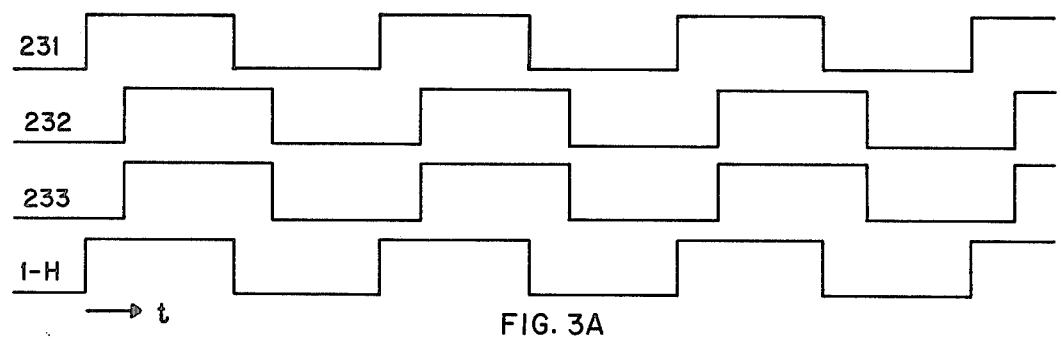
FIG. 3B depicts the resultant timing waveforms for corresponding points of FIG. 2 where a stuck-at-zero fault occurs on the 110M bus of FIG. 2, resulting in a stuck-at-zero condition for point 231 of FIG. 2. The fault is assumed to occur at time point 301 of FIG. 3B.
FIG. 3C depicts the resultant timing waveforms for corresponding points of FIG. 2 where a stuck-at-one fault occurs on the 110M bus of FIG. 1. The fault is assumed to occur at time point 311 of FIG. 3B.
Figure 3B:
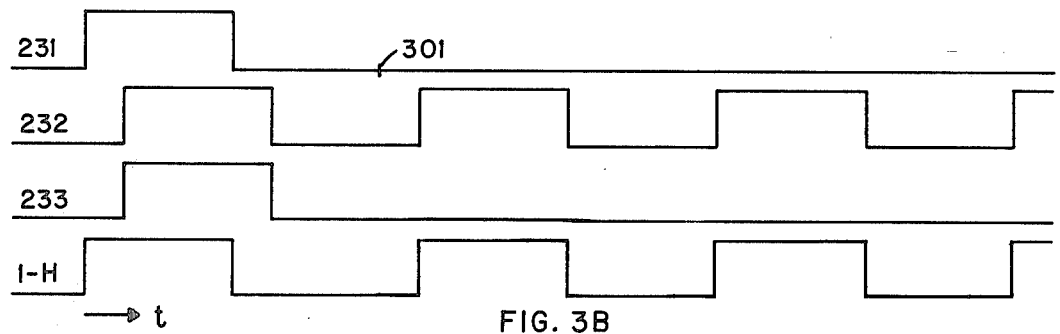
Figure 3C:
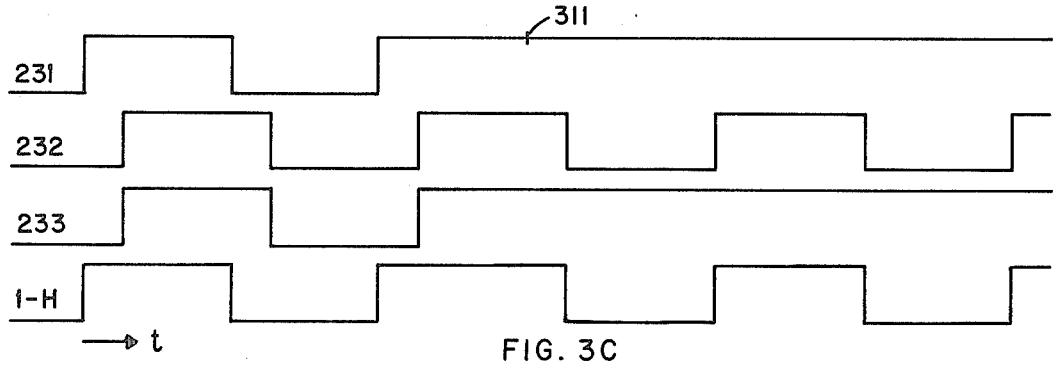

For either type of fault, FIG. 3B or FIG. 3C, it is seen that the maximum deviation from a normal clock pulse period in the event of a fault will be equal to the phase difference between the two clock pulse sources prior to the fault condition. Hence, the deviation may be kept quite small by various techniques, well known in the art, for minimizing the phase difference between master and slave clock sources.

Figure 1:
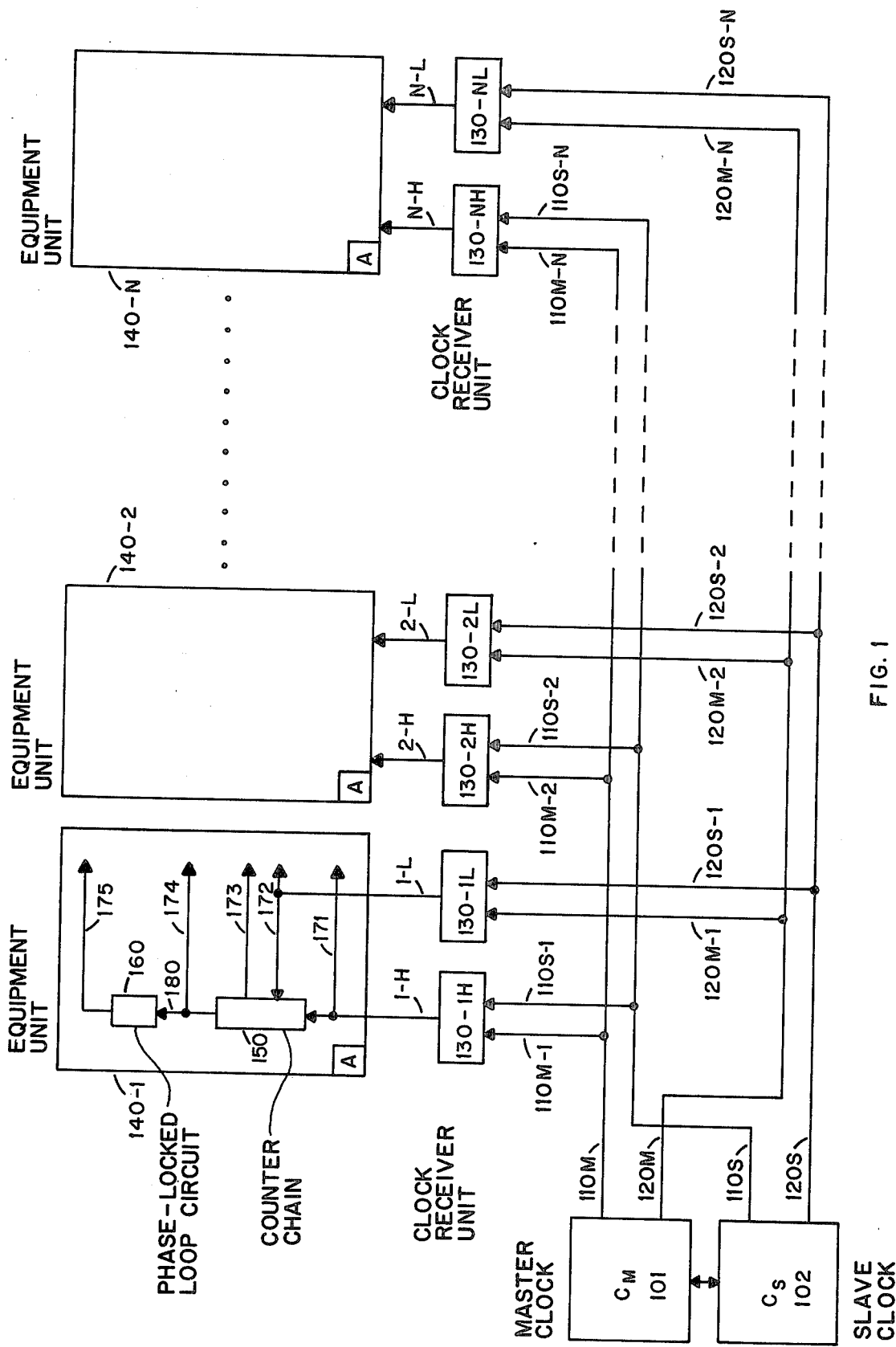
Figure 2:
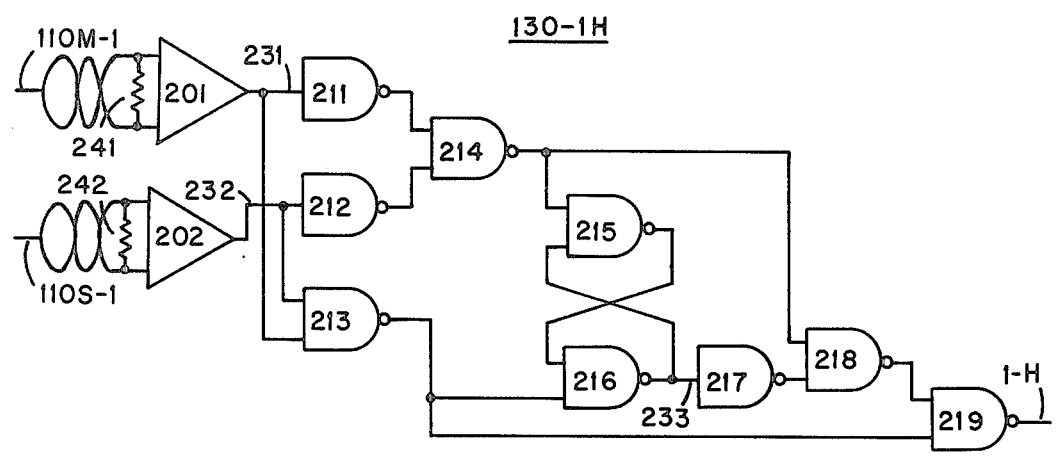

It should be finally noted that, since the master and slave clocks 101 and 102 of FIG. 1 have outputs distributed over separate bus paths, either clock may comprise the phase leading clock at any particular clock receiver unit.

It should be noted that the invention described herein has been illustrated with reference to a particular embodiment. Many details used to facilitate the description of such particular embodiment are chosen for convenience only and without limitation on the scope of the invention. Other embodiments may be devised by those skilled in the art without departing from the scope and spirit of the invention. Accordingly, the invention is intended to be limited only by the scope and spirit of the appended claims .

What is claimed is:

1. An arrangement for providing fault-tolerant distribution of clock signals to a plurality of equipment units comprising;
   a plurality of clock receiver units, each unit associated with one of the equipment units and having first and second inputs, an output coupled to at least one distribution point in the associated equipment unit, each clock receiver unit including sequential logic means operative to produce at the clock receiver unit output a signal that is substantially a reproduction of a signal appearing at that clock receiver unit input that leads in phase a signal appearing at the other clock receiver unit input,
   first and second sources of clock signals,
   first clock signal transmission means for coupling clock signals from the first source to the first input of each of the plurality of clock receiver units, and
   second clock signal transmission means for coupling clock signals from the second source to the second input of each of the plurality of clock receiver units.

2. An arrangement according to claim 1 wherein the first and second clock signal transmission means respectively include first and second twisted cable pairs and wherein each clock receiver unit further comprises;
   means for respectively coupling the first and second twisted cable pairs to the first and second inputs of the clock receiver unit including first and second impedances respectively coupled across the first and second cable pairs for minimizing signal reflections therein, and first and second bus receiver amplifiers having inputs respectively coupled across the first and second impedances and having input impedances substantially greater than the first and second impedances.

3. An arrangement according to claim 2 wherein each sequential logic means further comprises;
   first, second, and third logical inverters each having an input and an output,
   first, second, third, fourth, fifth, and sixth logical NAND gates, each having first and second inputs and an output,
   the inputs of the first and second inverters respectively coupled to outputs of the first and second bus receiver amplifiers, the outputs of the first and second inverters respectively coupled to the first and second inputs of the first NAND gate,
   the first and second inputs of the second NAND gate respectively coupled to the outputs of the first and second bus receiver amplifiers,
   the third NAND gate output coupled to the first input of the fourth NAND gate, the fourth NAND gate output coupled to the first input of the third NAND gate, the second input of the third NAND gate coupled to the output of the first NAND gate, the second input of the fourth NAND gate coupled to the output of the second NAND gate,
   the input of third inverter coupled to the output of the fourth NAND gate, the output of the third inverter coupled to the first input of the fifth NAND gate,
   the second input of the fifth NAND gate coupled to the output of the first NAND gate, the output of the fifth NAND gate coupled to the first input of the sixth NAND gate,
   the second input of the sixth NAND gate coupled to the output of the second NAND gate, and the output of the sixth NAND gate coupled to the output of the clock receiver unit.

4. An arrangement for providing fault-tolerant distribution of clock signals to a plurality of equipment units comprising;
   a plurality of clock receiver units arranged in pairs, each pair associated with a different one of the plurality of equipment units, each clock receiver unit including a first input, a second input, an output coupled to at least one distribution point in the associated equipment units, and sequential logic means operative to produce at the clock receiver unit output a signal that is substantially a reproduction of a signal appearing at that input of the clock receiver unit that leads in phase a signal appearing at the other input of the clock receiver unit,
   first and second sources of clock signals for producing clock frequency outputs at a predetermined high frequency,
   third and fourth sources of clock signals for producing clock frequency outputs at a predetermined low frequency,
   first clock signal transmission means for coupling the first source of clock signals to the first input of the first clock receiver unit of each receiver unit pair,
   second clock signal transmission means for coupling the second source of clock signals to the second input of the first clock receiver unit of each receiver unit pair,
   third clock signal transmission means for coupling the third source of clock signals to the first input of the second clock receiver unit of each receiver unit pair, and
   fourth clock signal transmission means for coupling the fourth source of clock signals to the second input of the second clock receiver unit of each receiver unit pair.

5. An arrangement according to claim 4 wherein the first, second, third, and fourth clock signal transmission means respectively include first, second, third, and fourth twisted cable pairs and wherein each clock receiver unit further comprises;
   means for respectively coupling two twisted cable pairs to the first and second inputs of the clock receiver unit including first and second impedances respectively coupled across the two cable pairs for minimizing signal reflections therein, and first and second bus receiver amplifiers having inputs respectively coupled across the first and second impedance.

6. An arrangement according to claim 5 wherein each sequential logic means further comprises;
   first, second, and third logical inverters each having an input and an output,
   first, second, third, fourth, fifth, and sixth logical NAND gates each having a first input, a second input, and an output,
   the inputs of the first and second inverters respectively coupled to outputs of the first and second bus receiver amplifiers, the outputs of the first and second inverters respectively coupled to the inputs of the first NAND gate, the inputs of the second NAND gate respectively coupled to the outputs of the first and second bus receiver amplifiers, the third NAND gate output coupled to the first input of the fourth NAND gate, the fourth NAND gate output coupled to the first input of the third NAND gate, the second input of the third NAND gate coupled to the output of the first NAND gate, the second input of the fourth NAND gate coupled to the output of the second NAND gate, the input of the third inverter coupled to the output of the fourth NAND gate, the output of the third inverter coupled to the first input of the fifth NAND gate, the second input of the fifth NAND gate coupled to the output of the first NAND gate, the output of the fifth NAND gate coupled to the first input of the sixth NAND gate, the second input of the sixth NAND gate coupled to the output of the second NAND gate, and the output of the sixth NAND gate coupled to the output of the clock receiver unit.

* * * * *